Figure 1:
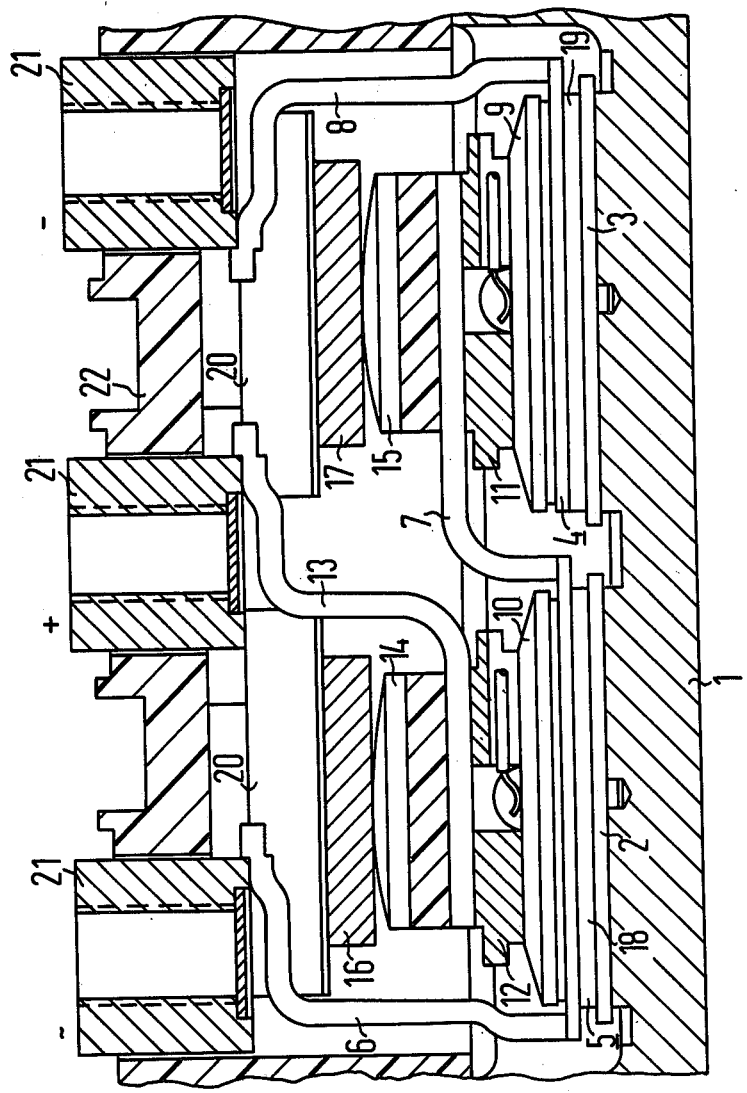

United States Patent [19]

Bahlinger

[11] 4,390,891

[45] Jun. 28, 1983

[54] SEMICONDUCTOR COMPONENT WITH A PLURALITY OF SEMICONDUCTOR ELEMENTS

[75] Inventor: Walter Bahlinger, Munich, Fed. Rep. of Germany

[73] Assignee: Siemens Aktiengesellschaft, Berlin and Munich, Fed. Rep. of Germany

[21] Appl. No.: 188,592

[22] Filed: Sep. 18, 1980

[30] Foreign Application Priority Data

Oct. 19, 1979 [DE] Fed. Rep. of Germany ....... 2942409

[51] Int. Cl.³ .............................................. H01L 23/42
[52] U.S. Cl. ....................................... 357/79; 357/75; 357/81
[58] Field of Search ......................... 357/79, 75, 81, 68

[56] References Cited

U.S. PATENT DOCUMENTS 4,106,052 8/1978 Schierz ................................. 357/72
4,218,695 8/1980 Egerbacher et al. ................. 357/79

FOREIGN PATENT DOCUMENTS 1559969 1/1980 United Kingdom .

*Primary Examiner*—James W. Davie
*Attorney, Agent, or Firm*—Herbert L. Lerner; Laurence A. Greenberg

[57] ABSTRACT

Semiconductor component having a plurality of semiconductor elements disposed in a case, including a bottom of the case, and case terminals, including conductor bars electrically connecting the semiconductor elements to each other and to the case terminals, the semiconductor elements being in thermal and pressure contact with the bottom through at least one of said conductor bars and being electrically insulated from the bottom, pressure contacts disposed between the semiconductor elements and said conductor bars, the conductor bars being formed of first sections of relatively large width associated with the pressure contacts, and second sections of relatively small width connected to the first sections.

4 Claims, 3 Drawing Figures

SEMICONDUCTOR COMPONENT WITH A PLURALITY OF SEMICONDUCTOR ELEMENTS

The present invention relates to a semiconductor component with several semiconductor elements which are disposed in a case, are connected electrically to each other and to case terminals by conductor bars and are in thermal contact with the bottom of the case through at least one of the conductor bars but are electrically insulated therefrom, and with pressure contacts between the semiconductor elements, the conductor bars and the bottom of the case.

Such a semiconductor component has already been described in the prior art. In this semiconductor component, the semiconductor elements are connected to each other and to the case terminals by metallic contact strips. The contact strips make contact with the semiconductor elements under pressure delivered by a spring. Likewise, a contact strip makes contact under pressure with the bottom of the case for each semiconductor element, and small plates each formed of an electrically insulating but highly thermally conducting material such as beryllium oxide or aluminum oxide is dispoed between the contact strip and the bottom of the case.

The contact strips disposed between the bottom and the semiconductor elements have three purposes, namely to carry current, to make contact and to remove heat. If the power is relatively low, a silver-plated copper strip, for instance, is sufficient for this purpose. On the one hand, the strip makes contact with the semiconductor elements, and on the other hand, it connects the semiconductor elements to the case terminals.

For larger power ratings and consequently larger semiconductor areas, the pressure contact must meet more stringent requirements. It must be as flat as possible and its surface must be such that a contact which is as uniform as possible over the entire area is ensured for the entire operating time of the semiconductor component. It is known to provide a durable pressure contact, such as by lapping the surfaces which lie on top of each other under pressure to make them flat, for instance. With a conductor of strip material, this is not directly possible, however.

It is accordingly an object of the invention to provide a semiconductor component with a plurality of semiconductor elements which overcomes the hereinafore-mentioned disadvantages of the heretofore-known devices of this general type, and to do so in such a manner that the conductor bar can serve for making pressure contact as well as for carrying current.

With the foregoing and other objects in view there is provided, in accordance with the invention, a semiconductor component having a plurality of semiconductor elements disposed in a case, including a bottom of the case, and case terminals, comprising conductor bars electrically connecting the semiconductor elements to each other and to the case terminals, the semiconductor elements being in thermal and pressure contact with the bottom through at least one of the conductor bars and being electrically insulated from the bottom, pressure contacts disposed between the semiconductor elements and the conductor bars, the conductor bars being formed of first sections of relatively lage width associated with the pressure contacts, and second sections of relatively small width connected to or following the first sections.

In accordance with another feature of the invention, the first sections of the conductor bars are circular and have diameters being at least substantially equal to the diameter of the semiconductor elements.

In accordance with a further feature of the invention, the first sections of the conductor bars have a surface resting against the semiconductor elements, the first sections being flat and uniformly roughened at least on the surface resting against the semiconductor elements.

In accordance with an added feature of the invention, the first sections of the conductor bars are thicker than the second sections.

In accordance with an additional feature of the invention, there are provided extensions integral with the first sections of the conductor bars, the second sections being joined to the extensions by soldering.

In accordance with yet another feature of the invention, the second sections of the conductor bars are butted to the extensions at the solder joint.

In accordance with a concomitant feature of the invention, the second sections of the conductor bars are connected between the semiconductor elements and the case terminals and are at least substantially parallel to the first sections in the vicinity of the case terminals.

Other features which are considered as characteristic for the invention are set forth in the appended claims.

Although the invention is illustrated and described herein as embodied in a semiconductor component with a plurality of semiconductor elements, it is nevertheless not intended to be limited to the details shown, since various modifications and structural changes may be made therein without departing from the spirit of the invention and within the scope and range of equivalents of the claims.

Figure 2:
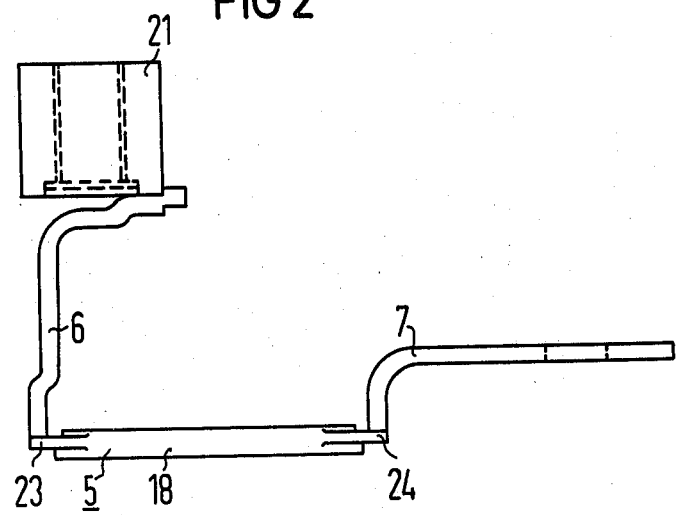
Figure 3:
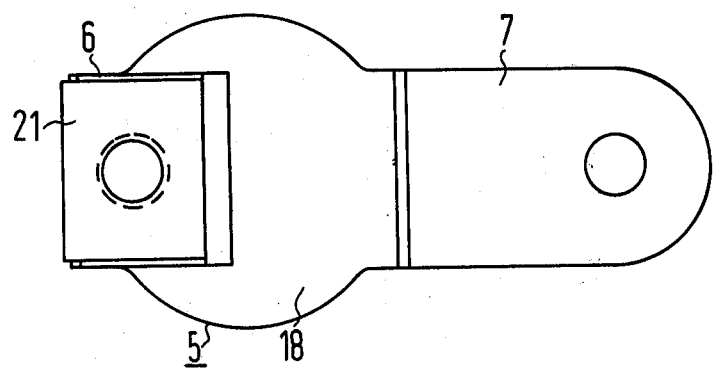

The construction and method of operation of the invention, however, together with additional objects and advantages thereof will be best understood from the following description of specific embodiments when read in connection with the accompanying drawings, in which:

FIG. 1 is a fragmentary diagrammatic longitudinal sectional view through a semiconductor component according to the invention; and FIGS. 2 and 3 are side elevational and top plan views respectively, of a conductor bar used in the semiconductor component according to FIG. 1.

Referring now to the figures of the drawing and first, particularly to FIG. 1 thereof, it is seen that the semiconductor component shown therein has a metallic bottom 1. On the bottom 1 are disposed discs 2, 3 of highly thermally conducting but electrically insulating material such as beryllium oxide or aluminum oxide. Lying on the discs 2, 3 in sequence are conductor bars 5 and 4, semiconductor elements 10, 9 and pressure pieces 12, 11, respectively. On the pressure piece 12 rests a conductor bar 13 which connects the semiconductor element 10 to one of the case terminals 21. A section 7 of the conductor bar 5 rests on the pressure piece 11. Insulators 14, 15 having an upper part formed of metal and a crowned shape, are placed on the conductor bar 13 and the section 7 of the conductor bar 5, respectively. The insulators 14, 15 are loaded by leaf springs 16, 17 which have ends that are anchored to the bottom 1 by yokes 20. For the sake of clarity, the anchors are not shown in the drawing. The semiconductor component is covered up by a cover 22 which is formed of plastic, for instance, and through which the case terminals 21 are brought.

The conductor bars 5 and 4 include first sections 18, 19 associated with the pressure contacts, and further sections 6, 7, 8, which only serve for carrying current. The first sections 18, 19 are wider than the other sections 6, 7, 8. They are advantageously circular like the semiconductor elements 10, 9 and have at least the same diameter as the latter, which makes centering simple. For reasons of good electrical and thermal contact, the sections 18, 19 are, for instance, lapped flat or also ground down. The other sections 6, 7 and 8, on the other hand, can have the smallest cross section which will still be permissible for the required current. The hereinafore-mentioned sections and the conductor bar 13 can therefore be readily adapted to the construction requirements in the interior of the case by bending or offsetting.

The sections 18, 19 of the current bars 5 and 4, respectively, can be made thicker than the other sections 6, 7 and 8 if the use of the semiconductor component in installations stressed by large surge currents calls for a certain amount of thermal storage capacity. The sections 18, 19, may, for instance, have three times the thickness of the other sections 6, 7 and 8. It is also possible to provide the first sections 18, 19 along their circumference or periphery with a step in such a manner that their diameter is smaller than the diameter of the discs 2, 3. In this manner, increased dielectric strength from the bottom 1 of the case to the sections 18, 19 is achieved.

In FIGS. 2 and 3, the conductor bar 5 is separately shown in detail. Like parts as in FIG. 1 are provided with the same reference numerals. The other sections 6, 7 are connected to the first section 18 associated with the pressure contact by extensions 23, 24 attached to the section 18. They may be soldered, for instance, to the surface of the extensions with a butt joint.

The sections 6, 8 and the conductor bar 13, respectively, which are connected to the case terminals can be angled-off in the vicinity of the case terminals so that they are at least approximately parallel to the first sections 18, 19. This serves the purpose of preventing mechanical stresses in the sections 18, 19 caused by different distances between the case terminals 21 and the abovementioned extensions of the first sections 5, 4. This is aided by the relatively small cross section of the sections 6, 8 and the conductor bar 13, respectively.

There are claimed:

1. Semiconductor component having a plurality of semiconductor elements disposed in a case, including a bottom of the case, and case terminals, comprising conductor bars electrically connecting the semiconductor elements to each other and to the case terminals, the semiconductor elements being in thermal and pressure contact with the bottom through at least one of said conductor bars and being electrically insulated from the bottom, pressure contacts disposed between the semiconductor elements and said conductor bars, said conductor bars being formed of first sections of relatively large width associated with the pressure contacts, and second sections of relatively small width connected to said first sections, said first sections of said conductor bars being circular and having diameters being at least substantially equal to the diameter of the semiconductor elements, and said first sections of said conductor bars having a surface resting against the semiconductor elements, said first sections being lapped flat and uniformly roughened at least on said surface resting against the semiconductor elements.

2. Semiconductor component according to claim 1, including extensions integral with said first sections of said conductor bars, said second sections being joined to said extensions by soldering.

3. Semiconductor component according to claim 2, wherein said second sections of said conductor bars are butted to said extensions at said solder joint.

4. Semiconductor component according to claim 1, wherein said second sections of said conductor bars are connected between the semiconductor elements and the case terminals and are at least substantially parallel to said first sections in the vicinity of said case terminals.

* * * * *